United States Patent [19]
Sakemi

[11] Patent Number: 5,713,126
[45] Date of Patent: Feb. 3, 1998

[54] METHOD OF MOUNTING ELECTRONIC CONNECTOR ON AN END OF PRINTED CIRCUIT BOARD

[75] Inventor: Shoji Sakemi, Fukuoka, Japan

[73] Assignee: Matsushita Electric Industrial Co., Ltd., Osaka, Japan

[21] Appl. No.: 672,300

[22] Filed: Jun. 28, 1996

Related U.S. Application Data

[63] Continuation of Ser. No. 360,066, Dec. 20, 1994, abandoned.

[30] Foreign Application Priority Data

Dec. 24, 1993 [JP] Japan .................................. 5-329037

[51] Int. Cl.$^6$ ...................................................... H05K 3/34
[52] U.S. Cl. ........................... 29/843; 29/884; 228/180.22; 439/62; 439/83
[58] Field of Search ......................... 29/842, 843, 884, 29/885; 439/59, 62, 79, 83; 228/180.21, 180.22

[56] References Cited

U.S. PATENT DOCUMENTS

| | | | |
|---|---|---|---|
| 4,091,529 | 5/1978 | Zaleckas | 29/843 |
| 4,734,042 | 3/1988 | Martens et al. | 439/62 |
| 4,991,666 | 2/1991 | Septtons et al. | 439/79 X |
| 5,239,748 | 8/1993 | Hamilton | 29/843 |
| 5,261,989 | 11/1993 | Ueltzen | 439/62 X |
| 5,307,929 | 5/1994 | Seidler | 29/884 X |
| 5,441,429 | 8/1995 | Seidler | 29/843 X |
| 5,609,490 | 3/1997 | Beesch et al. | 228/180.22 X |

FOREIGN PATENT DOCUMENTS

| | | | |
|---|---|---|---|
| 60-83358 | 5/1985 | Japan | 29/843 |
| 1204381 | 8/1989 | Japan | 29/843 |
| 4-014287 | 1/1992 | Japan | 29/843 |

OTHER PUBLICATIONS

Lipari, "Connectors and Printed Winning Boards", Western Electric, 1788, Technical Digest No. 62, Apr. 1981.

*Primary Examiner*—Peter Vo
*Attorney, Agent, or Firm*—Pollock, Vande Sande & Priddy

[57] ABSTRACT

A connector 1 has a connector main body 2, and a plurality of leads 3—3 protruding forward from a front surface of the connector main body 2. Each lead 3 is formed with an edge portion 3a. A plurality of terminals 6—6 are formed on an end of a printed circuit board 5. Each terminal 6 is formed with a slit 7 extending in a longitudinal direction thereof. The slit 7 is engageable with the edge portion 3a of its corresponding lead 3. A precoat solder portion 8 is formed on each terminal 6. The edge portion 3a is coupled with its corresponding slit 7. And, the leads 3—3 are soldered onto their corresponding terminals 6—6 by melting the precoat solder portion 8, thereby firmly mounting the connector 2 on the end of the printed circuit board 5 without causing the dislocation of leads in a lateral direction with respect to their corresponding terminals.

11 Claims, 6 Drawing Sheets

METHOD OF MOUNTING ELECTRONIC CONNECTOR ON AN END OF PRINTED CIRCUIT BOARD

This application is a continuation of U.S. patent application Ser. No. 08/360,066, filed Dec. 20, 1994 now abandoned.

BACKGROUND OF THE INVENTION

1. Field of the Invention

The present invention relates to an electronic connector for electrically connecting a printed circuit board with an external device, and more particularly to a mounting method for soldering the electronic connector on an end of a printed circuit board.

2. Prior Art

In general, a variety of electronic components or parts are mounted on a printed circuit board which is to be incorporated in various electronic apparatus. Among these electronic components or parts, electronic connectors are characterized in that they are usually mounted on an end portion of a printed circuit board for realizing the required function of electrically connecting the printed circuit board to an external device.

A conventionally well-known connector comprises a connector main body made of synthetic resin mold, a plurality of leads protruding in a row from an upper front of the connector main body, and a plurality of ligulate pieces protruding in a row from a lower front of the connector main body. Leads and ligulate pieces are parallel to each other and a clearance between these leads and ligulate pieces is substantially identical with a thickness of an edge of the printed circuit board to be coupled with this connector. Namely, a mounting operation of an electronic connector is carried out from the side of the printed circuit board, by clamping the end of the printed circuit board between the leads and ligulate pieces of the electronic connector. A plurality of terminals, corresponding to the leads, are provided on the end of the printed circuit board. A surface of each terminal is covered by precoat solder. The precoat solder is melted when received a thermal processing. Thus, the leads of the electronic connector are connected with their corresponding terminals by applying heat to the precoat solder.

However, according to the above-conventional mounting method, the electronic connector tends to slip in a lateral direction (i.e. a widthwise direction of a lead), undesirably displacing the lead offset from its corresponding terminal. Thus, there was a problem that the leads could not surely or stably be soldered onto their corresponding terminals.

SUMMARY OF THE INVENTION

Accordingly, in view of an above-described problem encountered in the prior art, a principal object of the present invention is to provide a method of mounting an electronic connector on an end of a printed circuit board, capable of preventing positional dislocation of the connector in the lateral direction thereof and ensuring the soldering operation of each lead onto the terminal of the printed circuit board.

In order to accomplish this and other related objects, a first aspect of the present invention provides a method of mounting a connector on an end of a printed circuit board comprising the steps of: preparing a connector having a connector main body, and a plurality of leads protruding forward from a front surface of the connector main body, at least one of the leads being formed with an edge portion; forming terminals on the end of the printed circuit board, at least one of the terminals being formed with a slit extending in a longitudinal direction thereof, the slit being engageable with an edge portion of its corresponding lead; providing a precoat solder portion on the terminals; coupling the edge portion with its corresponding slit; and soldering the leads onto the terminals by melting the precoat solder portion.

With this arrangement, the connector is firmly mounted on the end of the printed circuit board without causing the dislocation of leads in a lateral direction with respect to their corresponding terminals.

It is preferable in the above first aspect of the present invention that the edge portion is a V-shaped edge formed on a lead having a polygonal transverse cross section, or that the lead having an edge portion is a bent plate having a V-shaped lateral cross section.

Furthermore, it is preferable that the terminal provided with the slit is bifurcated into two portions longitudinally extending from a base portion thereof, and the slit longitudinally extends between these bifurcated portions the terminal. Also, the precoat solder portion is bifurcated into two longitudinally extending portions, and the edge portion of the lead is located in position between the two longitudinally extending portions of the precoat solder portion.

Alternatively, it is preferable that the slit is provided between a pair of separated elongated terminals. And, the precoat solder portion is separated into two longitudinally extending portions, and the edge portion of the lead is located in position between the two longitudinally extending portions of the precoat solder.

Still further, it is preferable that the plurality leads are arranged to constitute a row of leads.

Moreover, a plurality of ligulate pieces are provided so as to protrude forward from the front surface of the connector main body. The plurality of leads constitute an upper row while the plurality of ligulate pieces constitute a lower row, so that the end of the printed circuit board is clamped between the upper row and lower Yet further, a plurality of secondary leads are provided so as to protrude forward from the front surface of the connector main body. The leads constitute an upper row while the secondary leads constitute a lower row, so that the end of the printed circuit board is clamped between the upper row and lower low.

Furthermore, a second aspect of the present invention provides a method of mounting a connector on an end of a printed circuit board comprising steps of: preparing a connector having a connector main body, and a plurality of leads protruding forward from a front surface of the connector main body; forming terminals on the end of the printed circuit board; providing an engagement mechanism between at least one of the leads and its corresponding terminal, the engaging mechanism preventing the connector from dislocating in a lateral direction with respect to the printed circuit board; providing a precoat solder portion on the terminals; coupling the connector and the printed circuit board using the engaging mechanism; and soldering the leads onto the terminals by melting the precoat solder portion.

It is preferable in the above second aspect of the present invention that the engaging mechanism comprises a protruding portion and a recessed portion engageable with each other.

Substantially the same effect as the above first aspect of the present invention is brought by this second aspect of the present invention.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1:
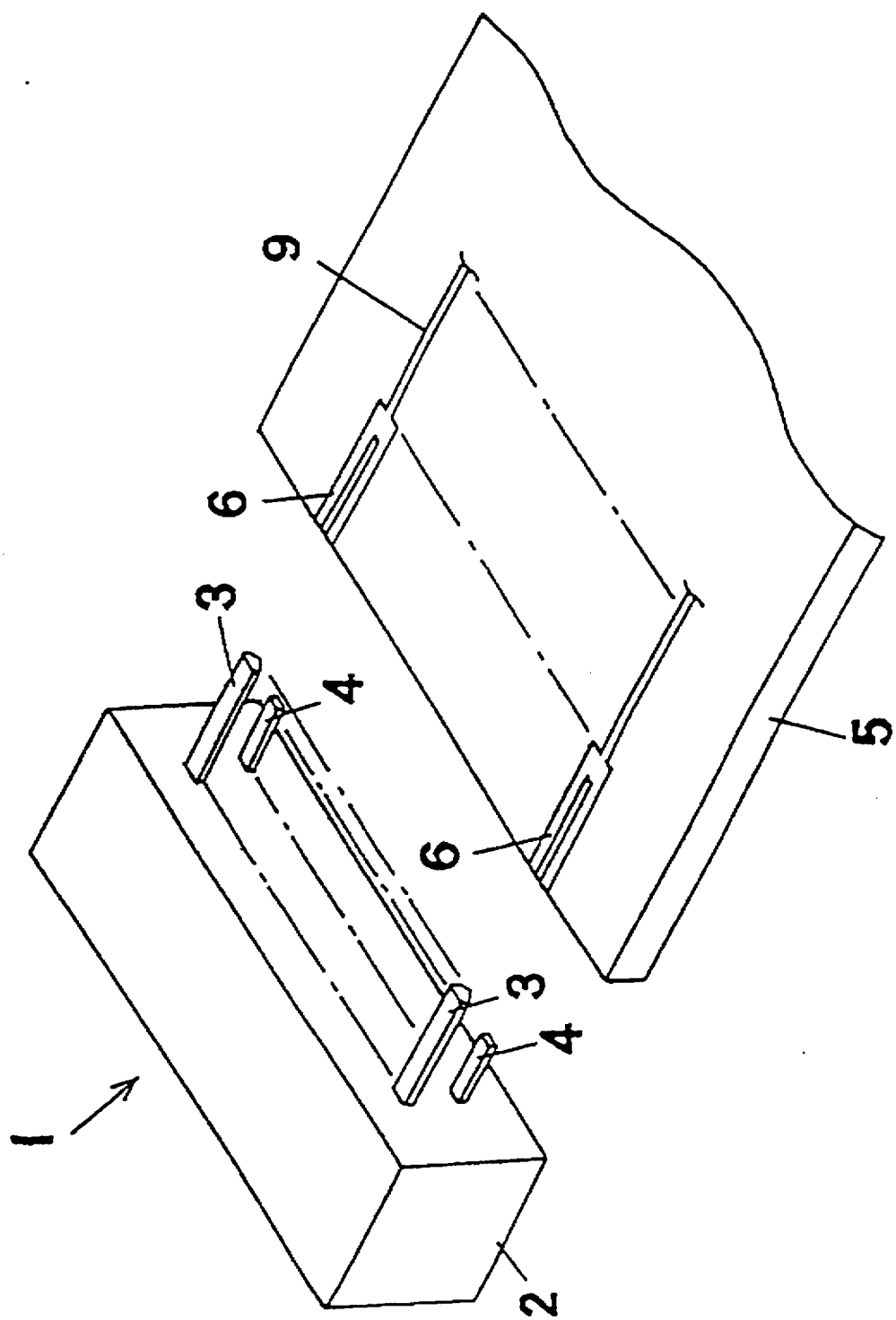
FIG. 1 is a perspective view showing an electronic connector and a printed circuit board in accordance with a first embodiment of the present invention.

Preferred embodiments of the method of mounting a connector onto the printed circuit board in accordance with the present invention will be explained in greater detail hereinafter, with reference to the accompanying drawings wherein the same reference numerals are applied to like parts. FIG. 1 is a perspective view showing an electronic connector and a printed circuit board in accordance with a first embodiment of the present invention. An electronic connector 1 comprises a connector main body 2 having an elongated box-like shape and made of synthetic resin mold, a plurality of leads 3—3 protruding in a row from an upper front of the connector main body 2, and a plurality of ligulate pieces 4—4 protruding in a row from a lower front of the connector main body 2. Leads 3—3 and ligulate pieces 4—4 are parallel to each other and a clearance between these leads 3—3 and ligulate pieces 4—4 is substantially identical with a thickness of an edge of a printed circuit board 5 to be coupled with this connector 1. A mounting operation of an electronic connector is carried out from the side of the printed circuit board 5, by clamping the end of the printed circuit board 5 between an upper row of the leads 3—3 and a lower row of the ligulate pieces 4—4. A plurality of terminals 6—6, corresponding to the leads 3—3, are provided on an end of the upper surface of the printed circuit board 5. A reference numeral 9 denotes a circuit pattern connected to a corresponding terminal 6.

Figure 2:
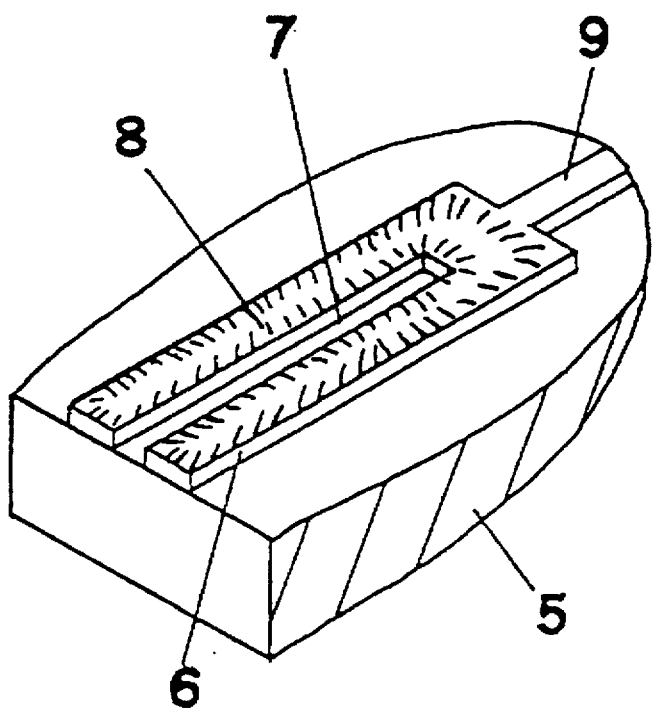
FIG. 2 is a perspective view partly showing a printed circuit board in accordance with the first embodiment of the present invention.

FIG. 2 is a perspective view partly showing the printed circuit board in accordance with the first embodiment of the present invention. Each terminal 6, flatly formed on the end of the upper surface of the printed circuit board 5, has a rectangular shape with a slit 7 provided along a longitudinal center thereof. In more detail, each terminal 6 is bifurcated into two portions longitudinally extending from a base portion thereof. These two longitudinally extending portions are parallel to each other. Thus, the slit 7 longitudinally extends between these bifurcated portions of the terminal 6. And, an outward end of the slit 7 opens at the edge of the printed circuit board 5, so as to receive an engaging edge of the corresponding lead later described. A precoat solder portion 8 is formed on the surface of each terminal 6. The precoat solder portion 8 is also bifurcated into two longitudinally extending portions parallel to each other.

Figure 3:
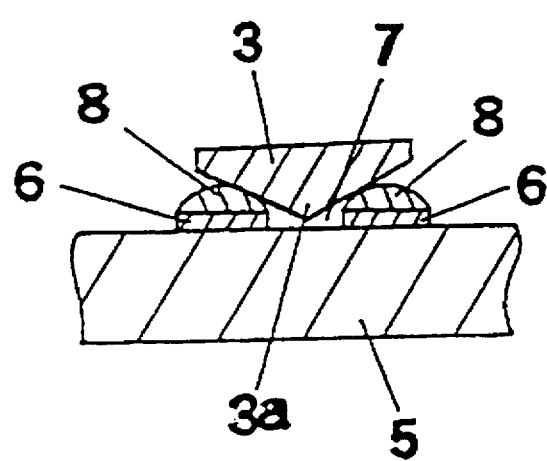
FIG. 3 is a cross-sectional view illustrating a condition of a lead of an electronic connector mounted on precoat solder of its corresponding terminal in accordance with the first embodiment of the present invention.

FIG. 3 is a cross-sectional view illustrating a condition of each lead 3 mounted on the precoat solder portion 8 of its corresponding terminal 6 in accordance with the first embodiment of the present invention. Each lead 3 has a polygonal transverse cross section, such as a pentagon, a tetragon, and a triangle, characterized by a V-shaped edge 3a protruding downward. This V-shaped edge 3a functions as the engaging edge to be slid into and coupled with the slit 7 of the corresponding terminal 6.

Figure 4:
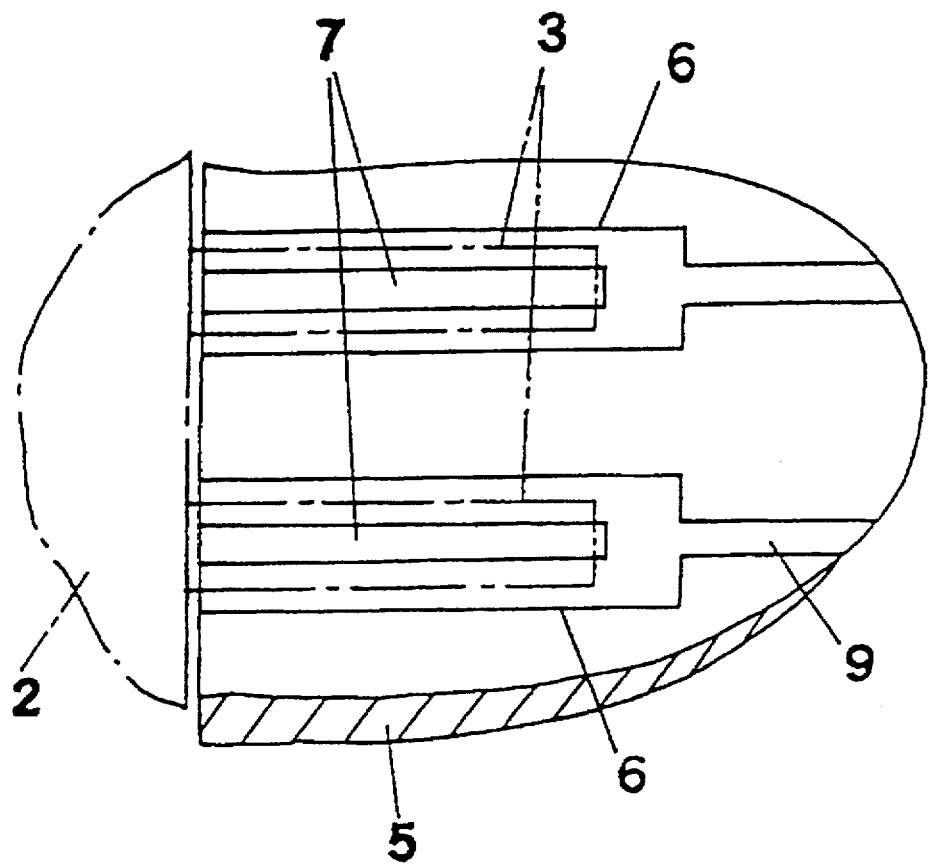
FIG. 4 is a plan view partly showing a condition of the electronic component mounted on an end of the printed circuit board in accordance with the first embodiment of the present invention.
Figure 5:
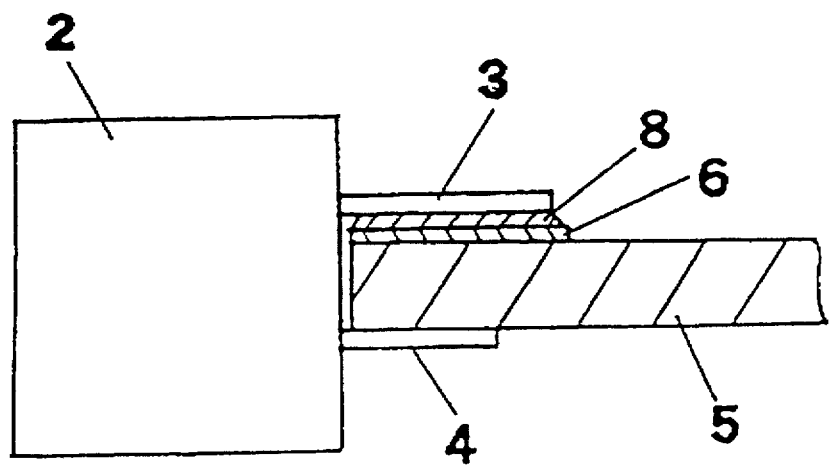
FIG. 5 is a cross-sectional view showing the condition of the electronic component mounted on the end of the printed circuit board in accordance with the first embodiment of the present invention.

FIG. 4 is a plan view partly showing a condition of the electronic component 1 mounted on an end of the printed circuit board 5 in accordance with the first embodiment of the present invention, while FIG. 5 is a cross-sectional view of the same.

A method of mounting the connector 1 on the end of the printed circuit board 5 will be explained with reference to these drawings. First of all, in the condition of FIG. 1, the connector main body 2, held by fingers of a worker, is coupled or engaged with the printed circuit board 5 by inserting the end of the printed circuit board 5 between the upper row of the leads 3—3 and the lower row of the ligulate pieces 4—4. With this insertion, the end of the printed circuit board 5 is clamped in an up-and-down direction by the leads 3—3 and the ligulate pieces 4—4 as shown in FIG. 5, thereby accomplishing installation of the electronic connector 1 on the printed circuit board 5. More specifically, the V-shaped edge 3a of the polygonal lead 3 is slid and inserted into the slit 7 as shown in FIG. 3, so that the V-shaped edge 3a is surely located in position between bifurcated precoat solder portions 8, 8 on the terminal 6. Thus, the lead 3 of the electronic connector 1 is firmly coupled or engaged with its corresponding terminal 6 on the printed circuit board 5. This arrangement is advantageous to avoid dislocation of each lead 3 in the lateral direction with respect to the corresponding terminal 6 because each lead 3 can be firmly held in the slit 7. Namely, the V-shaped edge 3a of the polygonal lead 3 and the slit 7 of the terminal 6 cooperatively constitute a secure or stable engagement mechanism. Thus, it is surely prevented that the lead 3 is unwantedly offset or displaced from its terminal 6.

Next, the printed circuit board 5 is transferred into a furnace of an associated reflow device, and applied a thermal processing. The precoat solder portion 8 is melted when received heat. Subsequently, the printed circuit board 5 is cooled down to harden the melted precoat solder portion 8, thereby soldering each lead 3 onto its corresponding terminal 6.

Figure 6:
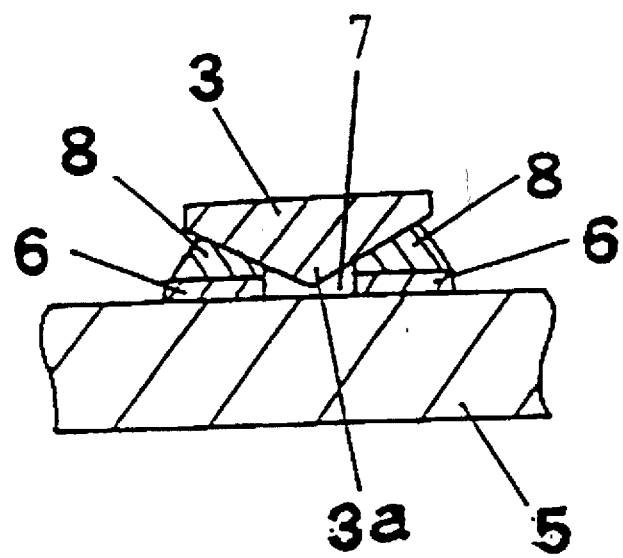
FIG. 6 is a cross-sectional view showing a condition of the lead soldered on the terminal on the printed circuit board in accordance with the first embodiment of the present invention.

FIG. 6 is a cross-sectional view showing a condition of the lead 3 soldered via the precoat solder portion 8 on its corresponding terminal 6 on the printed circuit board 5 in accordance with the first embodiment of the present invention. As shown in FIG. 6, the cured precoat solder portion 8 firmly solders the tapered lower surface of the lead 3 to the terminal 6.

Figure 7:
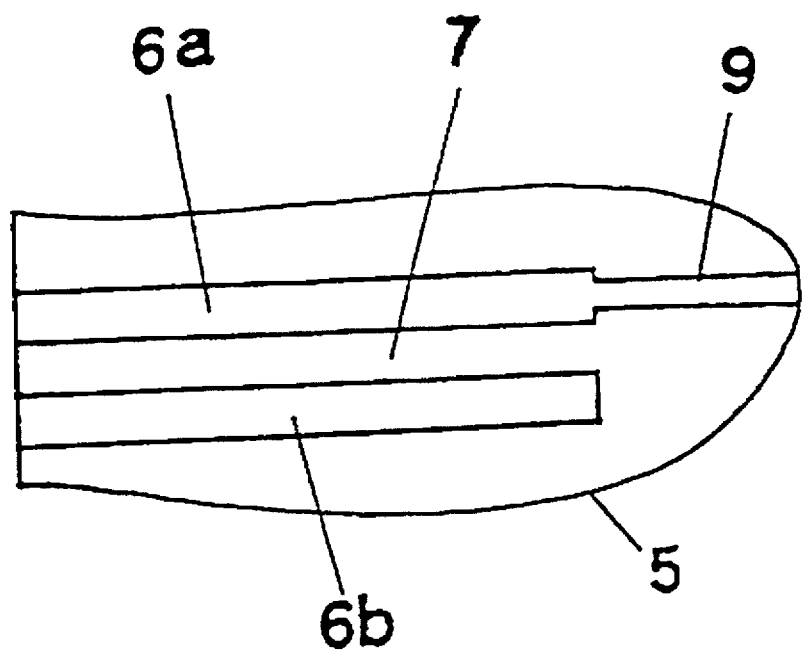
FIG. 7 is a plan view partly showing a printed circuit board in accordance with a second embodiment of the present invention.
Figure 8:
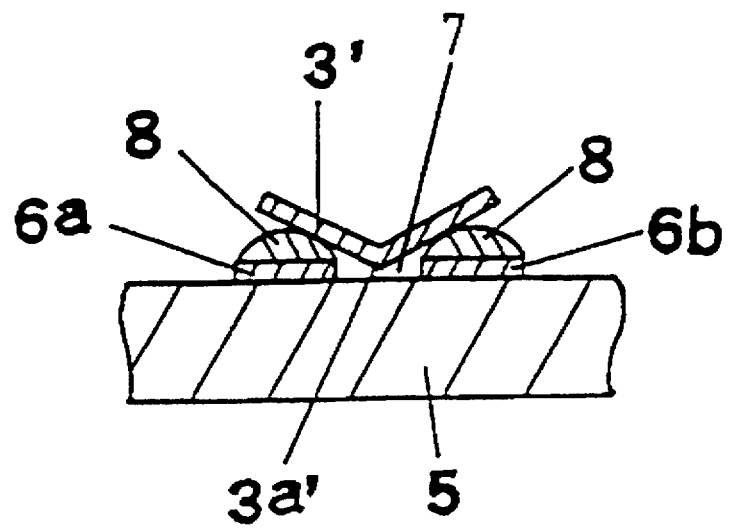
FIG. 8 is a cross-sectional view illustrating a condition of a lead of an electronic connector mounted on precoat solder of its corresponding terminal in accordance with the second embodiment of the present invention.
Figure 9:
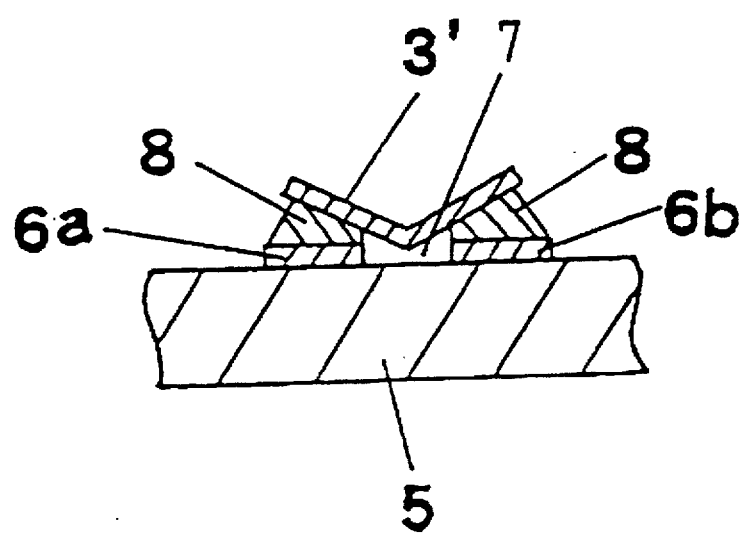
FIG. 9 is a cross-sectional view showing a condition of the lead soldered on the terminal on the printed circuit board in accordance with the second embodiment of the present invention.

Next, a second embodiment of the present invention will be explained. FIG. 7 is a plan view partly showing a printed circuit board in accordance with the second embodiment of the present invention. FIG. 8 is a cross-sectional view illustrating a condition of a lead of an electronic connector mounted on the precoat solder portion of its corresponding terminal in accordance with the second embodiment of the present invention. FIG. 9 is a cross-sectional view showing a condition of the lead soldered on the terminal on the printed circuit board in accordance with the second embodiment of the present invention.

This second embodiment is different from the first embodiment in the shape of each terminal and each lead. Namely, each terminal consists of a pair of elongated rectangular flat terminals 6a and 6b, which are parallel to each other and separated completely. The slit 7 is provided between the separated terminals 6a and 6b, so as to extend in the longitudinal direction of the terminal. The outer end of the slit 7 opens at the end of the printed circuit board 5, to receive an engaging edge of the corresponding lead. The precoat solder portion 8 is formed on the surface of each terminal 6a or 6b. Thus, the precoat solder portion 8 is also separated into two longitudinally extending portions parallel to each other. Each lead 3' of an electronic connector 1 is a bent plate having a V-shaped lateral cross section. Tapered lower surface of each lead 3' is coupled with the slit 7. Accordingly, the lead 3' is firmly soldered on the paired terminals 6a and 6b as shown in FIG. 9, bringing substantially the same effect as that of the above-described first embodiment.

Figure 10:
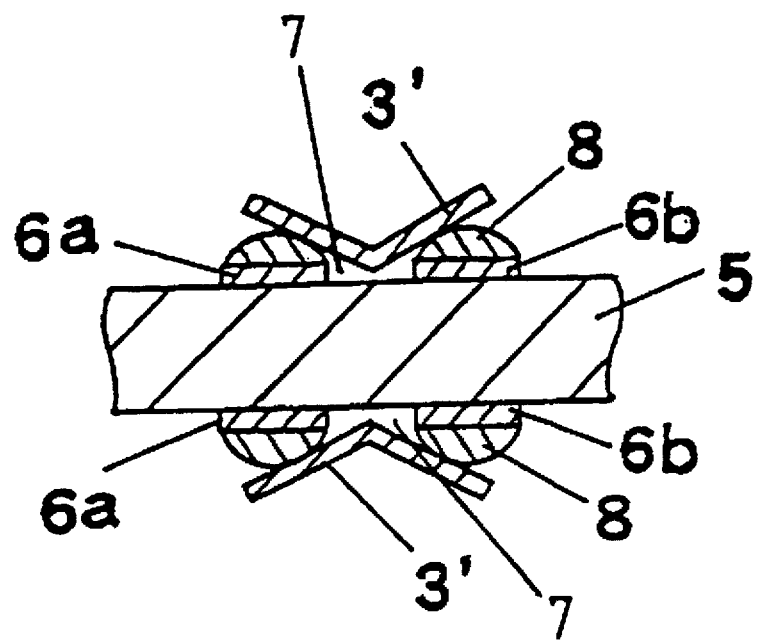
FIG. 10 is a cross-sectional view illustrating a condition of upper and lower leads of an electronic connector mounted on precoat solder of their corresponding terminals in accordance with a third embodiment of the present invention.

FIG. 10 is a cross-sectional view illustrating a condition of upper and lower leads of an electronic connector mounted on precoat solder of their corresponding terminals in accordance with a third embodiment of the present invention.

According to this third embodiment, the printed circuit board 5 has terminal 6a, 6b formed on each of the upper and lower surfaces of the end thereof. In this case, the ligulate pieces 4—4 of the electronic connector 1 are replaced by leads to be brought into contact with the lower terminals. More specifically, the electronic connector 1 has a plurality of upper leads 3'—3' protruding in a row from an upper front of the connector main body 2, and a plurality of lower leads 3'—3' protruding in a row from a lower front of the connector main body 2. Upper and lower leads 3'—3' and 3'—3' are parallel to each other and a clearance between these upper leads 3'—3' and lower leads 3'—3' is substantially identical with a thickness of an edge of the printed circuit board 5 to be coupled with this connector 1.

The electronic connector 1 is mounted from the side of the printed circuit board 5, by clamping the end of the printed circuit board 8 between an upper row of the upper leads 3'—3' and a lower row of the lower leads 3'—3' in the same manner as the above first and second embodiments.

Each terminal consists of a pair of elongated rectangular flat terminals 6a and 6b in the same manner as the second embodiment. Thus, the slit 7 is provided between the separated terminals 6a and 6b, so as to extend in the longitudinal direction of the terminal. The precoat solder portion 8 is formed on the surface of each terminal 6a or 6b. Thus, the precoat solder portion 8 is separated into two longitudinally extending portions parallel to each other. Each lead 3' of the electronic connector 1 is a bent plate having a V-shaped lateral cross section. Tapered lower surface of each lead 3' is slid into and coupled with the slit 7. Accordingly, the lead 3' is firmly soldered on the paired terminals 6a and 6b as shown in FIG. 10 at both sides of the end of the printed circuit board 5, bringing substantially the same effect as those of the above-described first and second embodiments.

Although each lead is formed into a shape having an engaging edge, it is needless to say that the engaging edge can be selectively formed on only two leads located at both ends of a row.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A method of mounting a connector on an end of a printed circuit board, comprising the steps of:

preparing a connector having a connector main body, and a plurality of leads protruding forward from a front surface of the connector main body, at least one of said leads being formed with an edge portion;

forming terminals on said end of the printed circuit board for contacting said leads, at least one of said terminals being formed with a slit extending in a longitudinal direction thereof, said slit being engageable with said edge portion of said at least one of said leads;

providing a precoat solder portion on said terminals;

coupling said edge portion with a corresponding slit; and soldering said leads onto said terminals by melting said precoat solder portion;

wherein said edge portion is a V-shaped edge formed on a lead having a polygonal transverse cross-section.

2. A method of mounting a connector on an end of a printed circuit board, comprising the steps of:

preparing a connector having a connector main body, and a plurality of leads protruding forward from a front surface of the connector main body, at least one of said leads being formed with an edge portion;

forming terminals on said end of the printed circuit board for contacting said leads, at least one of said terminals being formed with a slit extending in a longitudinal direction thereof, said slit being engageable with said edge portion of said at least one of said leads;

providing a precoat solder portion on said terminals;

coupling said edge portion of said at least one of said leads with said slit of said at least one of said terminals; and soldering said leads onto said terminals by melting said precoat solder portion;

wherein said lead having an edge portion which is a bent plate having a V-shaped lateral cross-section.

3. A method of mounting a connector on an end of a printed circuit board, said method comprising the steps of:

preparing a connector having a connector main body, and a plurality of leads protruding forward from a front surface of the connector main body, at least one of said leads being formed with an edge portion;

forming terminals on said end of the printed circuit board, at least one of said terminals being formed with a slit extending in a longitudinal direction thereof;

providing a precoat solder portion on said at least one of said terminals having said slit, thereby forming parallel ridges extending along said slit;

sliding said edge portion of the at least one lead along said parallel ridges which serve as a principal guide means for positively guiding said at least one lead having a shape for engaging said parallel ridges to a predetermined position on said printed circuit board, thereby positioning said plurality of leads of said connector onto corresponding terminals on the printed circuit board; and fixing said at least one lead on said at least one of said terminals by melting said precoat solder portion under the condition where said edge portion is engaged with said parallel ridges.

4. The mounting method in accordance with claim 3, wherein said terminal provided with the slit is bifurcated into two portions longitudinally extending from a base portion thereof, and said slit longitudinally extending between said bifurcated portions of the terminal.

5. The mounting method in accordance with claim 4, wherein said precoat solder portion is bifurcated into two longitudinally extending portions, and said protruding portion of the lead is located in position between said two longitudinally extending portions of the precoat solder portion.

6. The mounting method in accordance with claim 3, wherein said slit is provided between a pair of elongated separate portions of said at least one of said terminals.

7. The mounting method in accordance with claim 6, wherein said precoat solder portion is separated into two longitudinally extending portions, and said protruding portion of the lead is located in position between said two longitudinally extending portions of the precoat solder.

8. The mounting method in accordance with claim 3, wherein said plurality of leads are arranged to constitute a row of leads.

9. The mounting method in accordance with claim 3, further including a plurality of ligulate pieces protruding forward from the front surface of the connector main body, wherein said plurality of leads constitute an upper row while said plurality of ligulate pieces constitute a lower row, and said end of the printed circuit board is clamped between said upper row and lower low.

10. The mounting method in accordance with claim 3, which further including a plurality of secondary leads protruding forward from the front surface of the connector main body, wherein said leads constitute an upper row while said secondary leads constitute a lower row, and said end of the printed circuit board is clamped between said upper row and lower low.

11. A method of mounting a connector on an end of a printed circuit board, said method comprising the steps of:

preparing a connector having a connector main body, and a plurality of leads protruding forward from a front surface of the connector main body;

forming terminals on said end of the printed circuit board for contacting leads;

providing an engagement mechanism between at least one of said leads and a corresponding terminal, said engaging mechanism preventing said connector from being dislocated in a lateral direction with respect to the printed circuit board;

providing a precoat solder portion on said corresponding terminal, thereby forming a groove extending in a longitudinal direction and engageable with an edge portion formed on said at least one of said leads, said edge portion having a shape for engaging said groove, whereby said groove and said edge portion constituting said engagement mechanism;

coupling said connector and said printed circuit board by slidably engaging said edge portion to said groove, thereby positioning said plural leads of said connector onto corresponding terminals on the printed circuit board; and fixing said leads on said terminals by melting said precoat solder portion under the condition where said connector is coupled with said printed circuit board by said engaging mechanism.

* * * * *